(12) United States Patent  
Guo

(10) Patent No.: US 10,353,019 B2  
(45) Date of Patent: Jul. 16, 2019

(54) HIGH DYNAMIC RANGE MAGNETOMETER ARCHITECTURE

(71) Applicant: Apple Inc., Cupertino, CA (US)

(72) Inventor: Jian Guo, Milpitas, CA (US)

(73) Assignee: Apple Inc., Cupertino, CA (US)

(*) Notice: Subject to any disclaimer, the term of this patent is extended or adjusted under 35 U.S.C. 154(b) by 346 days.

(21) Appl. No.: 15/213,314

(22) Filed: Jul. 18, 2016

(65) Prior Publication Data

US 2018/0017635 A1    Jan. 18, 2018

(51) Int. Cl.
*G01R 33/00* (2006.01)
*G01R 33/09* (2006.01)

(52) U.S. Cl.
CPC ...... *G01R 33/0029* (2013.01); *G01R 33/0011* (2013.01); *G01R 33/093* (2013.01)

(58) Field of Classification Search
CPC ............ G01R 33/0029; G01R 33/0011; G01R 33/093
USPC .......................... 324/244, 249, 251–252, 260
See application file for complete search history.

(56) References Cited

U.S. PATENT DOCUMENTS

| | | | | |
|---|---|---|---|---|
| 3,248,645 A * | 4/1966 | Gilbert | ................... | G01R 33/07 324/251 |
| 4,005,358 A * | 1/1977 | Foner | ................. | G01R 33/1215 324/228 |
| 4,857,842 A * | 8/1989 | Sturman | ................. | G01B 7/003 324/225 |
| 5,525,901 A * | 6/1996 | Clymer | ................... | G01B 7/004 324/207.21 |
| 5,532,584 A * | 7/1996 | Jeffers | .................... | G01R 33/09 324/202 |
| 2005/0127899 A1 * | 6/2005 | Kakuta | .................... | G01D 5/14 324/207.2 |
| 2006/0087318 A1 * | 4/2006 | Crolly | .................... | G01R 33/09 324/252 |
| 2007/0034004 A1 * | 2/2007 | Cripe | ...................... | G01L 3/102 73/331 |
| 2010/0231222 A1 * | 9/2010 | Bazinet | .................. | G01R 33/04 324/345 |
| 2012/0086444 A1 * | 4/2012 | Chen | .................. | G01R 33/0029 324/251 |
| 2014/0051517 A1 * | 2/2014 | Russo | ................ | G01R 33/0035 463/37 |

(Continued)

*Primary Examiner* — Patrick Assouad
*Assistant Examiner* — Demetrius R Pretlow
(74) *Attorney, Agent, or Firm* — Fish & Richardson P.C.

(57) ABSTRACT

A high dynamic range magnetometer architecture and method are disclosed. In an embodiment, a magnetometer sensor comprises: a variable magnetic gain stage including a plurality of selectable signal gain paths, each signal gain path including a magnetic sensor and a magnetic flux concentrator, and for each signal gain path the magnetic flux concentrator being positioned a different distance from the magnetic flux concentrator to provide a different magnetic gain for the signal gain path; a variable magnetic sensing stage coupled to the variable magnetic gain stage, the variable magnetic sensing stage operable to provide variable magnetic sensing to each signal gain path; and a gain control stage coupled to the variable magnetic sensing stage, the gain control stage operable to select one of the signal gain paths and to provide signal conditioning to the selected signal gain path.

13 Claims, 4 Drawing Sheets

(56) References Cited

U.S. PATENT DOCUMENTS

2015/0115943 A1* 4/2015 Jin ..................... H04M 1/0245
                                                    324/226
2016/0146907 A1* 5/2016 Grimm ............... G01R 33/096
                                                    324/252
2017/0059666 A1* 3/2017 Horsley ............. G01R 33/0041

* cited by examiner

HIGH DYNAMIC RANGE MAGNETOMETER ARCHITECTURE

TECHNICAL FIELD

This disclosure relates generally to magnetometer sensors.

BACKGROUND

Magnetometer sensors can be used to measure the Earth's magnetic field. Conventional magnetometer sensors used in mobile devices suffer from limited dynamic range and can be easily saturated in an ambient environment.

SUMMARY

A high dynamic range magnetometer architecture and method are disclosed. In an embodiment, a magnetometer sensor comprises: a variable magnetic gain stage including a plurality of selectable signal gain paths, each signal gain path including a magnetic sensor and a magnetic flux concentrator, and for each signal gain path the magnetic flux concentrator being positioned a different distance from the magnetic flux concentrator to provide a different magnetic gain for the signal gain path; a variable magnetic sensing stage coupled to the variable magnetic gain stage, the variable magnetic sensing stage operable to provide variable magnetic sensing to each signal gain path; and a gain control stage coupled to the variable magnetic sensing stage, the gain control stage operable to select one of the signal gain paths and to provide signal conditioning to the selected signal gain path.

In another embodiment, a method comprises: obtaining, by a magnetometer sensor of an electronic device, an input magnetic field; processing, by the magnetometer, the input magnetic field on a first signal gain path through the magnetometer sensor, the first signal gain path including a first magnetic sensor and a first magnetic flux concentrator, the first magnetic flux concentrator being positioned a first distance from the first magnetic flux concentrator to provide a first magnetic gain for the first signal gain path; obtaining, by the magnetometer, an output signal representing a measurement of the magnetic field based on the input signal; and responsive to the measurement, processing the input magnetic field on a second signal gain path, the second signal gain path including a second magnetic sensor and a second magnetic flux concentrator, the second magnetic flux concentrator being positioned a second distance from the second magnetic flux concentrator to provide a second magnetic gain for the second signal gain path that is different than the first magnetic gain, where the second distance is greater than or less than the first distance.

In another embodiment, a method comprises: receiving a reference input magnetic field; selecting, by the magnetometer sensor, a signal gain path to receive the reference input magnetic field; calculating a total magnetic gain for the signal gain path; and calculating a calibration coefficient for the signal gain path based on the total magnetic gain for the signal gain path, a magnetic gain of a magnetic sensor in the signal gain path and a sensitivity associated with the magnetic sensor.

In another embodiment, a computing device comprises: a magnetometer sensor comprising: a variable magnetic gain stage including a plurality of selectable signal gain paths, each signal gain path including a magnetic sensor and a magnetic flux concentrator, and for each signal gain path the magnetic flux concentrator being positioned a different distance from the magnetic flux concentrator to provide a different magnetic gain for the signal gain path; a variable magnetic sensing stage coupled to the variable magnetic gain stage, the variable magnetic sensing stage operable to provide variable magnetic sensing to each signal gain path; a gain control stage coupled to the variable magnetic sensing stage, the gain control stage operable to select one of the signal gain paths and to provide signal conditioning to the selected signal gain path; one or more processors; memory storing one or more instructions, which, when executed by the one or more processors, causes the one or more processors to perform operations comprising: obtaining, from the magnetometer sensor, an output signal; and determining from the output signal compass direction data.

Particular embodiments disclosed herein provide one or more of the following advantages. The dynamic range of a magnetometer sensor can be increased to provide improved performance in ambient environments. A novel sensing cell design is disclosed that displaces magnetic flux concentrators in signal gain paths at various distances away from magnetic sensors (e.g., giant magneto-resistance (GMR) sensors). An array of such sensing cells can be integrated on a single silicon substrate and a gain control stage multiplexes each individual sensing cell to signal conditioning circuits depending on the magnitude of the incoming magnetic field. The signals read from the sensing cells with various magnetic sensing gain can be post-processed in the magnetometer sensor itself or outside the sensor by another circuit to result in high dynamic range output.

The details of the disclosed embodiments are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Example System

Figure 1:
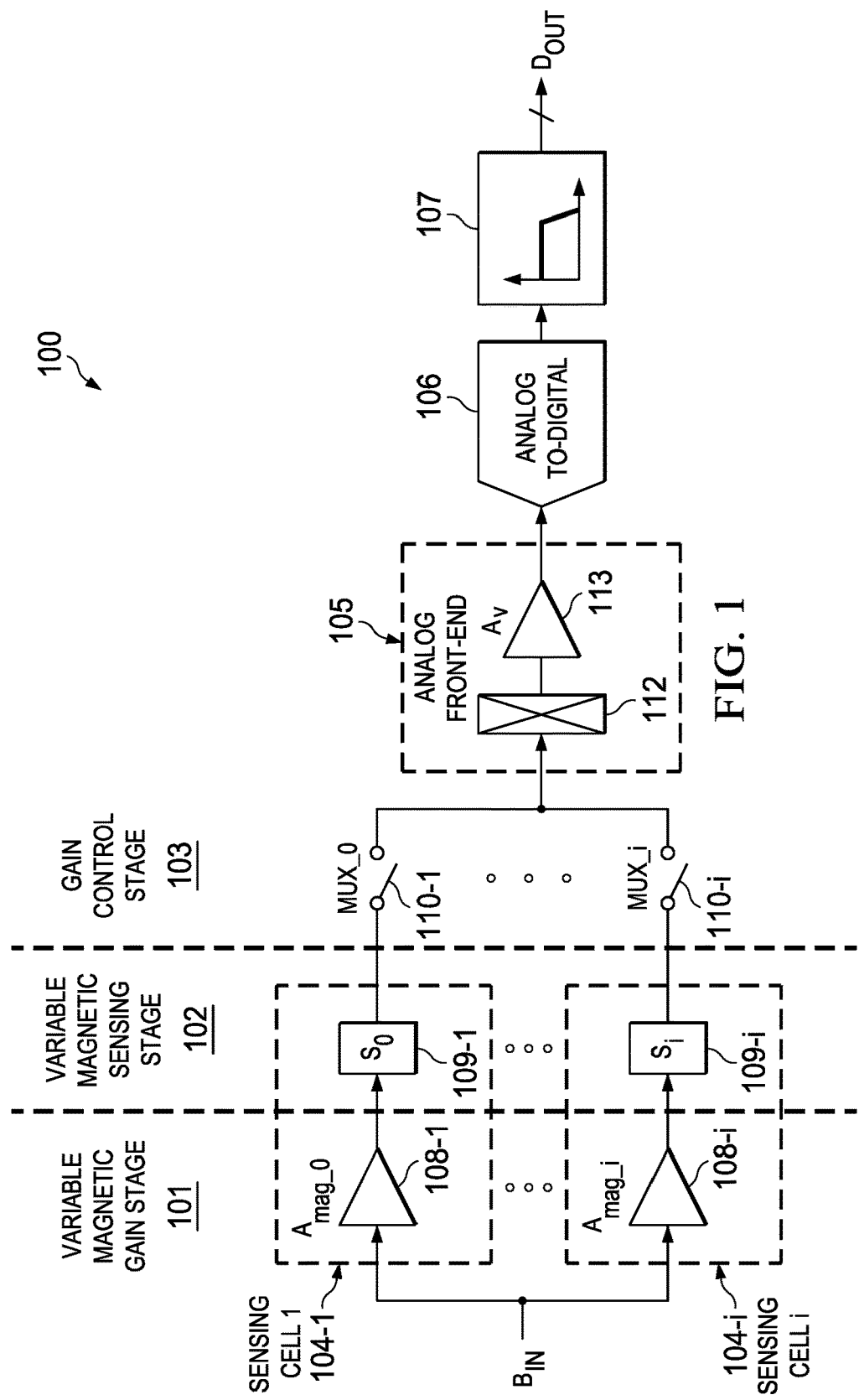
FIG. 1 is a conceptual diagram of an example high dynamic range magnetometer architecture, according to an embodiment.

FIG. 1 is a conceptual diagram of an example high dynamic range magnetometer architecture 100, according to an embodiment. Architecture 100 can be conceptually divided into three stages: variable magnetic gain stage 101, variable magnetic sensing stage 102 and gain control stage 103.

Architecture 100 includes sensing cells 104-1 . . . 104-$i$, analog front-end (AFE) 105, analog-to-digital converter (ADC) 106 and high-pass filter 107. Each sensing cell 104-1 . . . 104-$i$ includes a signal amplification component 108-1 . . . 108-$i$ and a magnetic field sensing component 109-1 . . . 109-$i$. In FIG. 1, $A_i$ represents the signal amplification gain of a magnetic flux concentrator and $S_i$ represents the sensitivity of a magnetic sensor (e.g., a GMR sensor). Sensing cells 104-1 . . . 104-$i$ can be coupled to AFE 105 by switches 110-1 . . . 110-$i$, respectively, to provide selectable signal gain paths. In an embodiment, switches 110-1 . . . 110-$i$ can be implemented by a i:1 multiplexer. AFE 105 includes offset compensation 112 and analog signal amplification 113 ($A_v$). ADC 106 together with digital low pass filter 114 generate digital output $D_{out}$ representing a measurement of the input magnet field $B_{IN}$. One or more control signals (not shown) coupled to switches 110-1 . . . 110-$i$ activate one of switches 110-1 . . . 110-$i$ to couple one of sensing cells 104-1 . . . 104-$i$ to AFE 106.

Figure 2A:
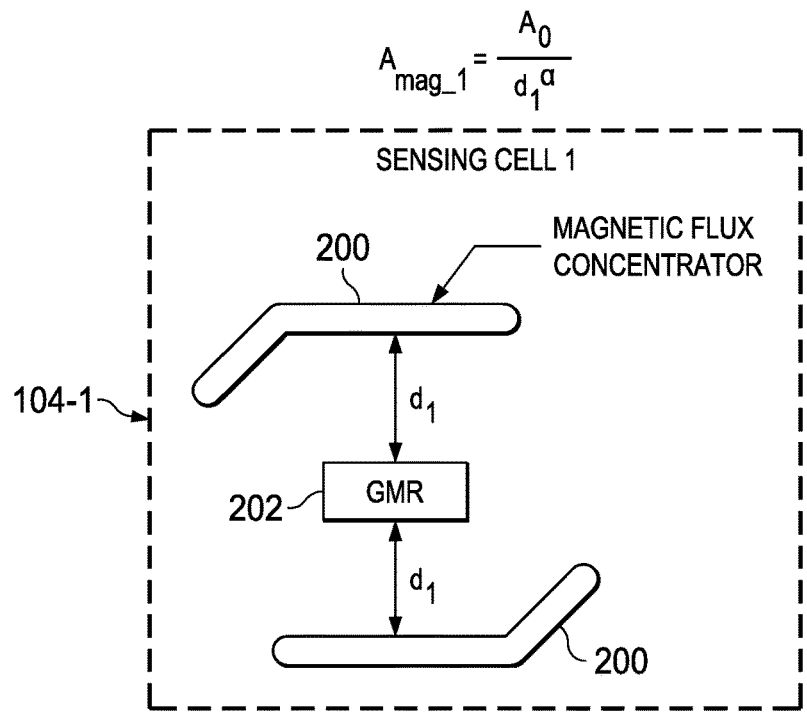
FIGS. 2A and 2B are conceptual diagrams illustrating a design to achieve variable magnetic gain, according to an embodiment.
Figure 2B:
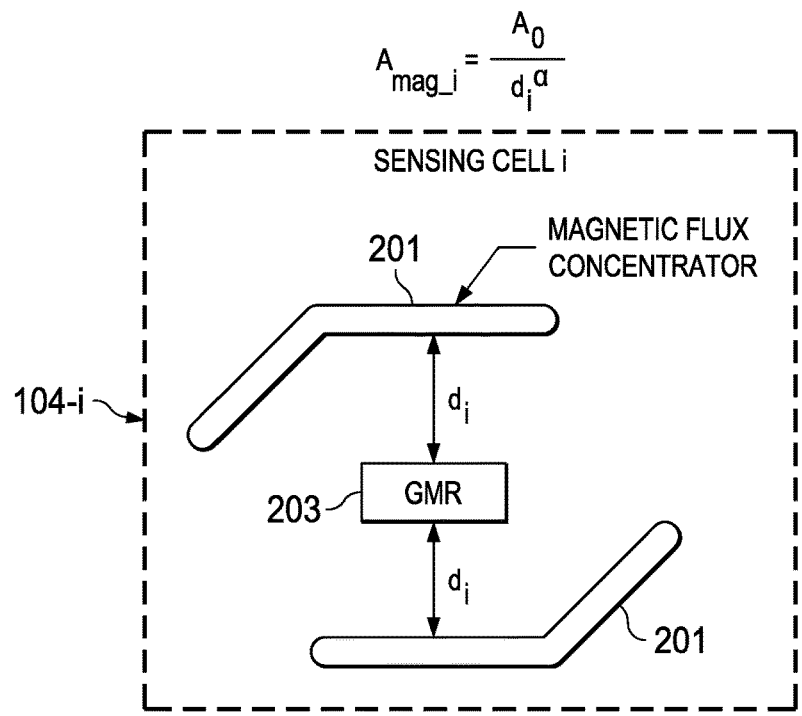

FIGS. 2A and 2B are conceptual diagrams illustrating a design to achieve variable magnetic gain, according to an embodiment. FIG. 2A illustrates a first sensing cell (sensing cell 104-1) and FIG. 2B illustrates an ith sensing cell (sensing cell 104-$i$). Each sensing cell includes magnetic flux concentrator 200, 201 and GMR sensor 202, 203. Magnetic flux concentrators 200, 201 form magnetic paths to channel magnetic flux generated by GMR sensors 202, 203, respectively, in a desired direction. In sensing cell 104-1, GMR sensor 202 is displaced a distance $d_1$ from magnetic flux concentrator 200. In sensing cell 104-$i$, GMR sensor 203 is displaced a distance $d_i$ from magnetic flux concentrator 201, where distance $d_1$ is different than distance $d_i$. Accordingly, each sensing cell 104-1 . . . 104-$i$ has a GMR sensor and a magnetic flux concentrator and the distance between the GMR sensor and magnetic flux concentrator is different for each sensing cell 104-1 . . . 104-$i$. At the GMR sensor location, the magnetic gain $A_{mag}$ provided by the magnetic flux concentrator is inversely proportional to the distance d. The magnetic gains $A_{mag\_1}$ and $A_{mag\_i}$ can be represented by Equations [1] and [2]:

$$A_{mag\_1} = \frac{A_o}{d_1^\alpha}, \quad [1]$$

$$A_{mag\_i} = \frac{A_0}{d_i^\alpha}, \quad [2]$$

where $\alpha$ represents a gain coefficient constant that is determined by design and validated by sensor characterization and $A_o$ is the analog signal amplification gain of the magnetic flux concentrator at the distance $d_0$. $A_o$ is a reference signal gain and can be set arbitrarily based on the actual design.

By placing the magnetic flux concentrators 200, 201 at various distances $d_i$ away from the GMR sensors 202, 203, variable magnetic gain can be achieved. The level of programmability for gain adjustment can be expanded by increasing the number of sensing cells 104-1 . . . 104-$i$.

Example Processes

Figure 3:
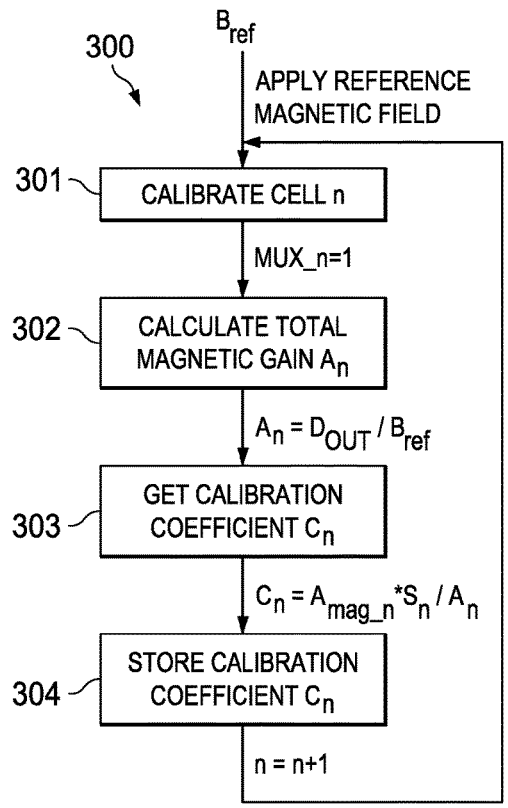
FIG. 3 is a flow diagram of an example calibration process, according to an embodiment.

FIG. 3 is a flow diagram of an example calibration process 300, according to an embodiment. The signal amplification gain of the magnetic flux concentrators $A_0$ . . . $A_n$ in sensing cells can be calibrated for precision magnetic sensing, where n is an index that indicates the nth signal amplification gain of the nth magnetic flux concentrator.

In some embodiments, process 300 can begin by applying a reference magnetic field $B_{ref}$ to each sensing cell in an iterative process. Each sensing cell is selected for calibration (301). For example, one or more control signals (e.g., provided by a state machine, processor or controller) can command a multiplexer to select a particular one of a number of sensing cells as described in reference to FIG. 1. After a sensing cell is selected for calibration, the total magnetic gain $A_n$ for the sensing cell is calculated (302). For example, $A_n$ can be calculated using, for example, Equation [3]:

$$A_n = \frac{D_{out\_n}}{B_{ref}}, \quad [3]$$

where $D_{out\_n}$ is the output of the magnetometer. The ratio in equation [3] can be calculated in the digital domain after analog-to-digital conversion.

Process 300 can continue by calculating a calibration coefficient $C_n$ from the total magnetic gain $A_n$ (303) using, for example, Equation [4]:

$$C_n = \frac{A_{mag\_n} * S_n}{A_n}, \quad [4]$$

where $S_n$ is the sensitivity of the magnetic sensor.

Process 300 can continue by storing the calibration coefficient $C_n$ (304) in, for example, memory, and then selecting the next sensing cell for calibration. The calibration continues until a calibration coefficient $C_n$ is calculated and stored for each of n sensing cells. The calibration coefficients $C_n$ can be retrieved from memory and used to calibrate the corresponding sensing cell output for precision magnetic sensing.

Figure 4:
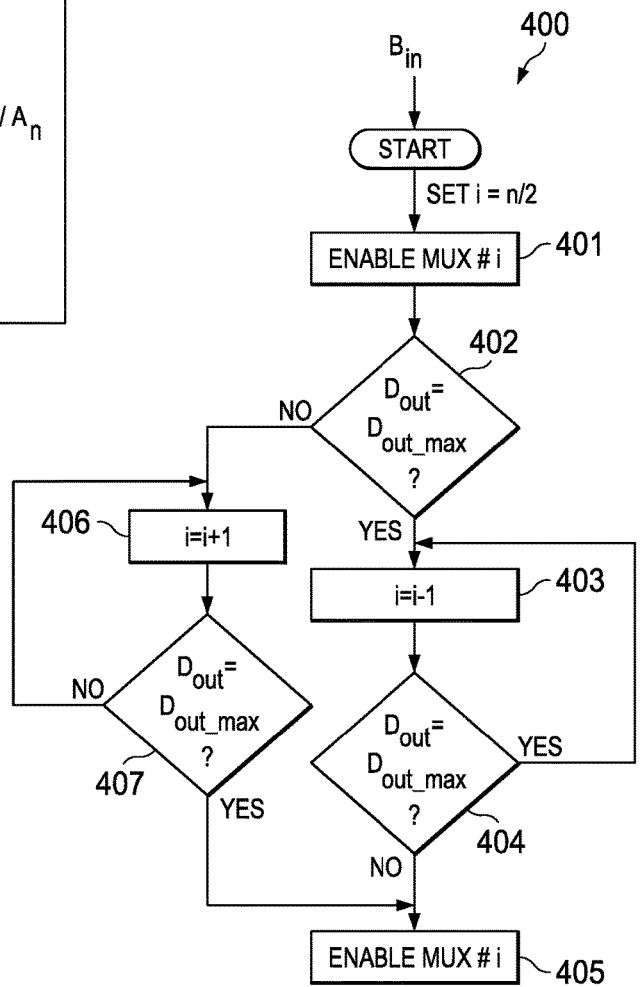
FIG. 4 is a flow diagram of an example process for adapting the high dynamic range magnetometer architecture in response to changing magnetic fields, according to an embodiment.

FIG. 4 is a flow diagram of an example process 400 for adapting the high dynamic range magnetometer architecture, according to an embodiment. In an embodiment, a magnetometer sensor including architecture 100 can be adapted to a changing magnetic field while deployed in a device (e.g., deployed in a mobile device) to improve dynamic gain.

In some embodiments, process 400 can begin by enabling a first signal gain path (401). For example, a control signal can select the ith signal gain path, where "i" is an index that is initialized as i=n/2, and where n is the total number of sensing cells (total number of signal gain paths). The magnetometer sensor output $D_{out\_i}$ is measured and compared against a maximum sensor output $D_{out\_max}$ (402), which can be pre-calculated and stored by the sensor. If $D_{out\_i}$ is equal to $D_{out\_max}$, the index is decremented by one (403) and the comparison is made again (404). If $D_{out\_i}$ does not equal $D_{out\_max}$, the ith sensing cell is enabled (405). Otherwise, the index "i" is decremented by one again (403) and so on until $D_{out\_i}$ does not equal $D_{out\_max}$.

If $D_{out\_i}$ is equal to $D_{out\_max}$, the index "i" is incremented by one (406) and the comparison is made again (407). If $D_{out\_i}$ equals $D_{out\_max}$, the ith sensing cell is enabled (405). Otherwise, the index is incremented by one again (406) and so on until $D_{out\_i}$ does not equal $D_{out\_max}$.

Example Device Architecture

Figure 5:
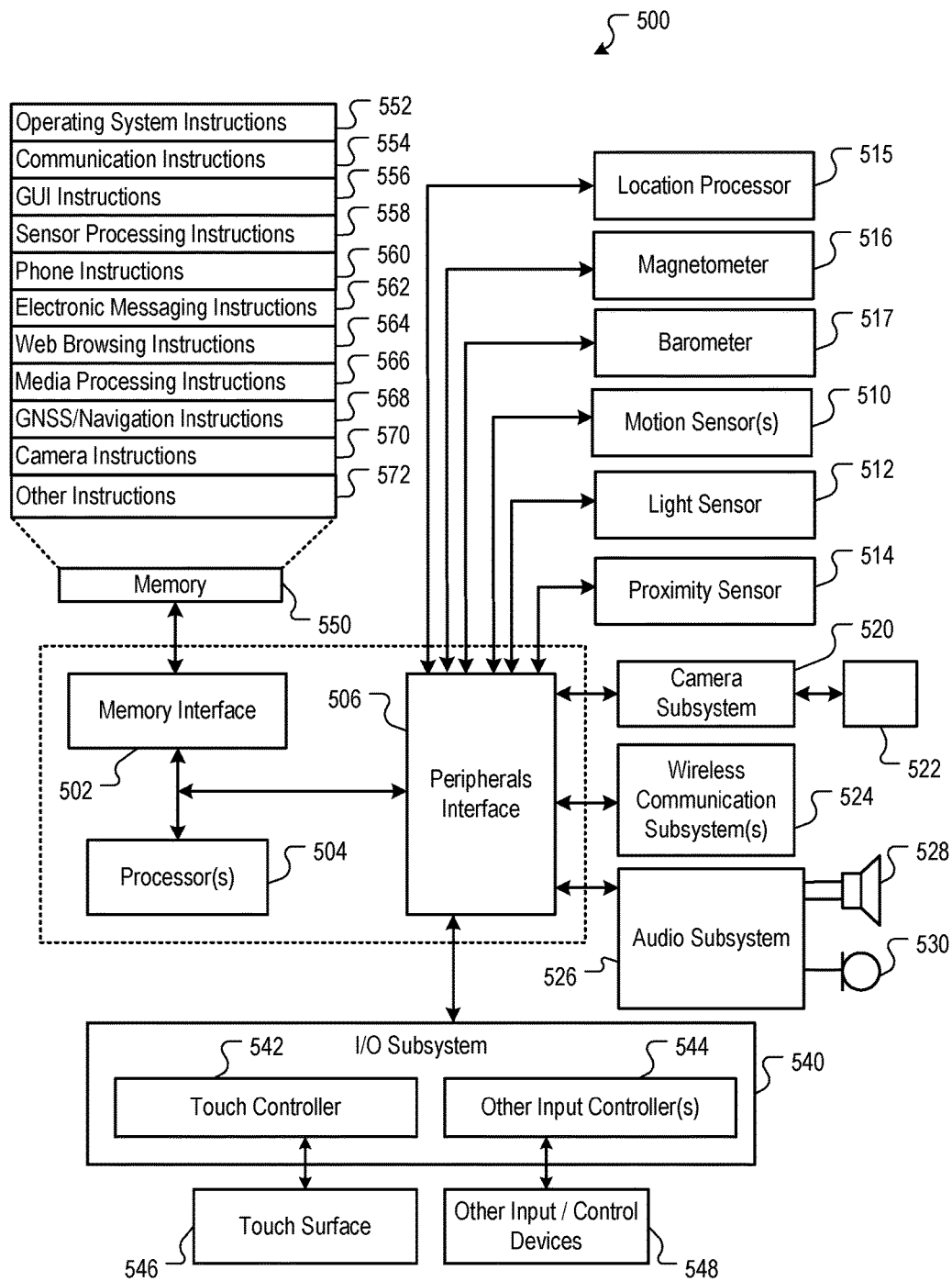
FIG. 5 is a block diagram of example device architecture for implementing the features and processes described in reference to FIGS. 1-4.

FIG. 5 is a block diagram of example device architecture 500 for implementing the features and processes described in reference to FIGS. 1-4. Architecture 500 may be implemented in any mobile device for generating the features and processes described in reference to FIGS. 1-4, including but not limited to smart phones and wearable computers (e.g., smart watches, fitness bands). Architecture 500 may include memory interface 502, data processor(s), image processor(s) or central processing unit(s) 504, and peripherals interface 506. Memory interface 502, processor(s) 504 or peripherals interface 506 may be separate components or may be integrated in one or more integrated circuits. One or more communication buses or signal lines may couple the various components.

Sensors, devices, and subsystems may be coupled to peripherals interface 506 to facilitate multiple functionalities. For example, motion sensor 510, light sensor 512, and proximity sensor 514 may be coupled to peripherals interface 506 to facilitate orientation, lighting, and proximity functions of the device. For example, in some implementations, light sensor 512 may be utilized to facilitate adjusting the brightness of touch surface 546. In some implementations, motion sensor 510 (e.g., an accelerometer, rate gyroscope) may be utilized to detect movement and orientation of the device. Accordingly, display objects or media may be presented according to a detected orientation (e.g., portrait or landscape).

Other sensors may also be connected to peripherals interface 506, such as a temperature sensor, a barometer 517, a biometric sensor, or other sensing device, to facilitate related functionalities. For example, a biometric sensor can detect fingerprints and monitor heart rate and other fitness parameters.

Location processor 515 (e.g., GNSS receiver chip) may be connected to peripherals interface 506 to provide georeferencing. Magnetometer sensor 516 (e.g., an integrated circuit chip) is connected to peripherals interface 506 to provide compass direction data that may be used by one or more applications to determine the direction of magnetic North. Magnetometer sensor includes the architecture described in reference to FIGS. 1-4.

Camera subsystem 520 and an optical sensor 522, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 524. Communication subsystem(s) 524 may include one or more wireless communication subsystems. Wireless communication sub systems 524 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and implementation of the communication subsystem 524 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network.

Wireless communication subsystems 524 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 526 may be coupled to a speaker 528 and one or more microphones 530 to facilitate voice-enabled functions, such as voice recognition, voice replication, digital recording, and telephony functions.

I/O subsystem 540 may include touch controller 542 and/or other input controller(s) 544. Touch controller 542 may be coupled to a touch surface 546. Touch surface 546 and touch controller 542 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 546. In one implementation, touch surface 546 may display virtual or soft buttons and a virtual keyboard, which may be used as an input/output device by the user.

Other input controller(s) 544 may be coupled to other input/control devices 548, such as one or more buttons, rocker switches, thumb-wheel, infrared port, USB port, and/or a pointer device such as a stylus. The one or more buttons (not shown) may include an up/down button for volume control of speaker 528 and/or microphone 530.

In some implementations, device 500 may present recorded audio and/or video files, such as MP3, AAC, and MPEG video files. In some implementations, device 500 may include the functionality of an MP3 player and may include a pin connector for tethering to other devices. Other input/output and control devices may be used.

Memory interface 502 may be coupled to memory 550. Memory 550 may include high-speed random access memory or non-volatile memory, such as one or more magnetic disk storage devices, one or more optical storage devices, or flash memory (e.g., NAND, NOR). Memory 550 may store operating system 552, such as Darwin, RTXC, LINUX, UNIX, OS X, iOS, WINDOWS, or an embedded operating system such as VxWorks. Operating system 552 may include instructions for handling basic system services and for performing hardware dependent tasks. In some implementations, operating system 552 may include a kernel (e.g., UNIX kernel).

Memory 550 may also store communication instructions 554 to facilitate communicating with one or more additional devices, one or more computers or servers, including peer-to-peer communications. Communication instructions 554 may also be used to select an operational mode or communication medium for use by the device, based on a geographic location (obtained by the GPS/Navigation instructions 568) of the device.

Memory 550 may include graphical user interface instructions 556 to facilitate graphic user interface processing, including a touch model for interpreting touch inputs and gestures; sensor processing instructions 558 to facilitate sensor-related processing and functions; phone instructions 560 to facilitate phone-related processes and functions; electronic messaging instructions 562 to facilitate electronic-messaging related processes and functions; web browsing instructions 564 to facilitate web browsing-related processes and functions; media processing instructions 566 to facilitate media processing-related processes and functions; GPS/Navigation instructions 568 to facilitate GPS and navigation-related processes; camera instructions 570 to facilitate camera-related processes and functions; and other instructions 572 for performing some or all of the features and processes, as described in reference to FIGS. 1-4.

Each of the above identified instructions and applications may correspond to a set of instructions for performing one or more functions described above. These instructions need not be implemented as separate software programs, procedures, or modules. Memory 550 may include additional instructions or fewer instructions. Furthermore, various functions of the device may be implemented in hardware and/or in software, including in one or more signal processing and/or application specific integrated circuits (ASICs).

A number of implementations have been described. Nevertheless, it will be understood that various modifications may be made. Elements of one or more implementations may be combined, deleted, modified, or supplemented to form further implementations. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A magnetometer sensor comprising:
a variable magnetic gain stage including a plurality of selectable signal gain paths, each signal gain path including a magnetic sensor and a magnetic flux concentrator, and for each signal gain path the magnetic flux concentrator being positioned a different distance from the magnetic flux concentrator to provide a different magnetic gain for the signal gain path;
a variable magnetic sensing stage coupled to the variable magnetic gain stage, the variable magnetic sensing stage operable to provide variable magnetic sensing to each signal gain path; and
a gain control stage coupled to the variable magnetic sensing stage, the gain control stage operable to select one of the signal gain paths and to provide signal conditioning to the selected signal gain path.

2. The magnetometer sensor of claim 1, further comprising:
an analog front-end (AFE) coupled to the gain control stage and operable to provide the signal conditioning.

3. The magnetometer sensor of claim 2, further comprising:
an analog-to-digital converter (ADC) coupled to the AFE; and
a digital low pass filter coupled to the ADC.

4. The magnetometer sensor of claim 2, wherein the AFE is operable to provide analog signal amplification $A_0$ and the ith magnetic gain $A_{mag\_i}$ is given by $$A_{mag\_i} = \frac{A_0}{d_i^\alpha},$$

where $\alpha$ is a gain coefficient constant based on sensor characterization.

5. The magnetometer sensor of claim 1, wherein the magnetic sensor is a giant magneto-resistance (GMR) sensor.

6. The magnetometer sensor of claim 1, wherein the magnetic gain provided by the magnetic flux concentrator is inversely proportional to the distance of the magnetic sensor from the magnetic flux concentrator.

7. A computing device comprising:
a magnetometer sensor comprising:
a variable magnetic gain stage including a plurality of selectable signal gain paths, each signal gain path including a magnetic sensor and a magnetic flux concentrator, and for each signal gain path the magnetic flux concentrator being positioned a different distance from the magnetic flux concentrator to provide a different magnetic gain for the signal gain path;
a variable magnetic sensing stage coupled to the variable magnetic gain stage, the variable magnetic sensing stage operable to provide variable magnetic sensing to each signal gain path;
a gain control stage coupled to the variable magnetic sensing stage, the gain control stage operable to select one of the signal gain paths and to provide signal conditioning to the selected signal gain path;
one or more processors;
memory storing one or more instructions, which, when executed by the one or more processors, causes the one or more processors to perform operations comprising;
obtaining, from the magnetometer sensor, an output signal; and
determining from the output signal compass direction data.

8. The computing device of claim 7, further comprising:
a display; and
a graphical processing unit operable to generate a graphical user interface for presentation on the display, the graphical user interface including a graphical indicator indicating a compass direction based on the compass direction data.

9. The computing device of claim 7, further comprising:
an analog front-end (AFE) coupled to the gain control stage and operable for providing the signal conditioning.

10. The computing device of claim 9, further comprising:
an analog-to-digital converter (ADC) coupled to the AFE; and
a digital low pass filter coupled to the ADC.

11. The computing device of claim 9, wherein the AFE is operable to provide analog signal amplification $A_0$ and the ith magnetic gain $A_{mag\_i}$ is given by $$A_{mag\_i} = \frac{A_0}{d_i^\alpha},$$

where $\alpha$ is a gain coefficient constant based on sensor characterization.

12. The computing device of claim 7, wherein the magnetic sensor is a giant magneto-resistance (GMR) sensor.

13. The computing device of claim 7, wherein the magnetic gain provided by the magnetic flux concentrator is inversely proportional to the distance of the magnetic sensor from the magnetic flux concentrator.

* * * * *